(12) United States Patent
Ganesan et al.

(10) Patent No.: US 9,332,643 B2
(45) Date of Patent: May 3, 2016

(54) INTERCONNECT ARCHITECTURE WITH STACKED FLEX CABLE

(71) Applicant: INTEL CORPORATION, Santa Clara, CA (US)

(72) Inventors: Sanka Ganesan, Chandler, AZ (US); Timothy M. Swettlen, Portland, OR (US); Gary B. Long, Aloha, OR (US); Donald T. Tran, Phoenix, AZ (US); Jill D. Murfin, Hillsboro, OR (US); David I. Amir, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/844,501

(22) Filed: Mar. 15, 2013

(65) Prior Publication Data

US 2014/0273552 A1    Sep. 18, 2014

(51) Int. Cl.
| | | |
|---|---|---|
| *H05K 1/00* | (2006.01) | |
| *H05K 1/14* | (2006.01) | |
| *H05K 3/36* | (2006.01) | |

(52) U.S. Cl.
CPC .............. *H05K 1/144* (2013.01); *H05K 1/147* (2013.01); *H05K 3/363* (2013.01); *H05K 2201/042* (2013.01); *H05K 2201/056* (2013.01); *H05K 2201/1053* (2013.01); *H05K 2201/10189* (2013.01); *H05K 2201/2009* (2013.01)

(58) Field of Classification Search
CPC .............. H05K 1/181; H05K 2201/10356; H05K 2201/1053; H05K 2201/10734; H05K 2203/167; H05K 3/28; H05K 3/282; H05K 3/361; H05K 7/00

USPC ........ 174/254, 261, 117 F, 117 FF, 268, 72 A; 361/749, 760, 785, 777; 439/67, 941, 439/77

See application file for complete search history.

(56) References Cited

U.S. PATENT DOCUMENTS

| | | | |
|---|---|---|---|
| 5,789,815 A * | 8/1998 | Tessier et al. ................ | 257/723 |
| 6,916,183 B2 | 7/2005 | Alger et al. ................... | 439/69 |
| 7,249,955 B2 | 7/2007 | Horine et al. ................. | 439/67 |
| 7,402,048 B2 * | 7/2008 | Meier et al. ................... | 439/65 |
| 7,705,447 B2 | 4/2010 | Ganesan et al. .............. | 257/713 |
| 7,888,784 B2 | 2/2011 | Gurumurthy et al. ........ | 257/685 |
| 8,188,594 B2 | 5/2012 | Ganesan et al. .............. | 257/713 |
| 8,353,101 B2 | 1/2013 | Gurumurthy et al. ......... | 29/829 |
| 8,508,947 B2 | 8/2013 | Ganesan et al. .............. | 361/749 |
| 8,915,747 B2 | 12/2014 | Chawla et al. ................ | 439/79 |
| 2005/0194669 A1 * | 9/2005 | Kim et al. ..................... | 257/678 |

(Continued)

OTHER PUBLICATIONS

All Flex Flexible Circuits, LLC web page (view from internet archive dated Feb. 1, 2013), https://web.archive.org/web/20130201095646/http://www.allflexinc.com/about.shtml.

(Continued)

*Primary Examiner* — Yuriy Semenenko
(74) *Attorney, Agent, or Firm* — Konrad Raynes Davda & Victor LLP; Alan S Raynes

(57) ABSTRACT

Stacked flex cable assemblies and their manufacture are described. One assembly includes a first flex cable and a second flex cable electrically coupled to the first flex cable. The assembly also includes a connector electrically coupled to the first flex cable. The first flex cable is positioned between the connector and the second flex cable. Other embodiments are described and claimed.

23 Claims, 11 Drawing Sheets

(56) References Cited

U.S. PATENT DOCUMENTS

| | | |
|---|---|---|
| 2006/0067066 A1* | 3/2006 | Meier et al. .................... 361/785 |
| 2007/0004241 A1* | 1/2007 | Meier et al. ..................... 439/67 |
| 2010/0078826 A1* | 4/2010 | Gurumurthy et al. ........ 257/774 |
| 2011/0021052 A1* | 1/2011 | Hirata et al. ................... 439/325 |
| 2014/0106582 A1 | 4/2014 | Wig et al. ....................... 439/78 |
| 2014/0217571 A1 | 8/2014 | Ganesan et al. .............. 257/693 |
| 2014/0217579 A1 | 8/2014 | Ganesan et al. .............. 257/737 |
| 2014/0268577 A1 | 9/2014 | Swaminathan et al. ...... 361/719 |

OTHER PUBLICATIONS

All Flex Flexible Circuits, LLC Design Guide (downloaded from internet archive dated Jul. 7, 2012), https://web.archive.org/web/20120707002152/http://www.allflexinc.com/PDF/GuideBookrev.pdf.

* cited by examiner

INTERCONNECT ARCHITECTURE WITH STACKED FLEX CABLE

BACKGROUND

There are a number of ways to interconnect signals from one electronic device to another. One method routes the signals through a package substrate of one device to a socket, onto a printed circuit board (PCB), and to another device, which may also be mounted on a package substrate and electrically coupled to the PCB through a socket. However, signals along such a path are susceptible to signal degradation and losses due to various parasitic mechanisms, transmission and return losses, and cross talk. The signal degradation and losses may be especially pronounced for high speed signals. Transmission losses may be reduced, for example, by constructing the PCB with materials having improved dielectric characteristics. However, significant degradation and losses may still be occur for longer interconnect paths and at higher signaling rates. Another way to interconnect signals uses flex cable that is electrically coupled to substrate packages and avoids routing the signals through the PCB. The flex cable may include a dielectric (insulating) material and an electrically conductive material, and conventionally includes a row of traces separated from a ground plane (or ground traces) by a dielectric layer.

DETAILED DESCRIPTION

In the following description, reference is made to the accompanying drawings which form a part hereof and which illustrate several embodiments of the present disclosure. It is understood that other embodiments may be utilized and structural and operational changes may be made without departing from the scope of the present description.

It has been found that the use of flex cable to form interconnections between electronic devices can enable high speed signaling while minimizing signal degradation and losses. However, to achieve enhanced speed with suitable loss characteristics for high performance applications using conventional flex cable, the width of the flex cable may become relatively large, for example, in a range of 70 to 150 mm. Such widths may interfere with other components in the system and also block air flow, which may be vital for cooling various components. Examples of high speed signaling systems may include Many Integrated Core (MIC) Exascale systems (400 GB/s Bandwidth per CPU, with 128 differential pairs) and HPC (high performance computing) systems, to achieve 25 Gb/s signal speed within an insertion loss budget of 25 dB and cross-talk-insertion loss margin of about 25 dB for about 15 inches of interconnect length from a device such as a CPU, to a device such as a router or switch. To achieve this signaling capability, one needs to minimize conductor loss, die electric loss, and cross-talk. These requirements lead to trace width/spacing for differential signals to values in the range of 100 µm to 125 µm and differential pairs pitch to the range of 500 µm (for stripline routing or microstrip routing with guard traces between differential pairs) to 1200 µm (for microstrip routing without guard traces between the differential pairs) in the flex cable. These flex design rules drive the conventional flex cable width to the range of 70-150 mm for the above bandwidth/signal density requirements. However, such a large flex cable width can interfere with other components in the system and also block air flow in. Certain embodiments as described herein provide for the formation of stacked flex cable assemblies having suitable properties and a smaller width such as, for example, approximately 35 mm.

Certain embodiments provide a more narrow flex cable configuration utilizing a stacked flex cable structure in which, for example, 50% of the signals are routed through a first flex cable, and 50% of the signals are routed through a second flex cable that is stacked on the first flex cable. Such a structure enables the flex cables to have a width that is reduced by 50%, because only half the number of signals are carried along the length of each flex cable.

Figure 1:
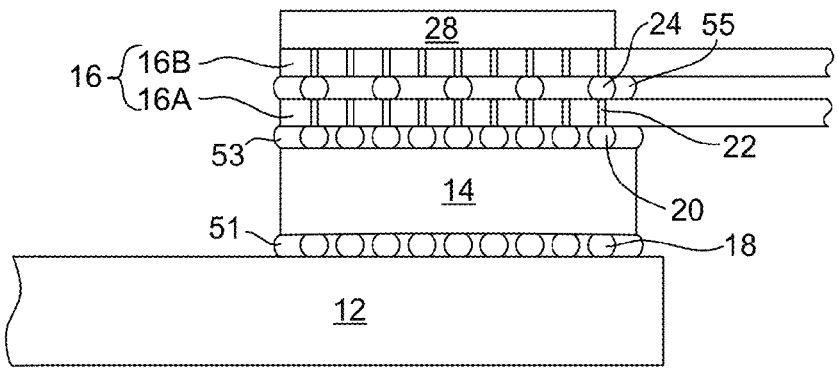
FIG. 1 illustrates a cross-sectional view of an assembly including a flex cable structure, in accordance with certain embodiments.

FIG. 1 illustrates a cross-sectional view of an assembly in accordance with certain embodiments, including s substrate 12 on which a connector 14 and a stacked flex cable 16 positioned thereon. As seen in FIG. 1, the stacked flex cable 16 includes flex cable 16A and flex cable 16B. The stacked flex cables 16A and 16B may each include a connection region where electrical connections are made to the connector 14, a transmission region extending towards another structure, and a break-out region between the connection region and the transmission region. The break-out region is the region where the electrical pathways transition from the connection region to the transmission region. These portions are described below in connection with FIG. 3. If desired, the assembly may include a stiffener 28 positioned, for example, on the flex cable 16B. The stiffener 28 is formed from a rigid material.

The substrate 12 may in certain embodiments comprise a variety of electronic devices such as, for example, a semiconductor die, a package including a semiconductor die such as a CPU (central processing unit) package, or a structure such as, for example, a dongle. A dongle may in certain embodiments act as a package extender so that the electrical connections to a device such as a CPU can be positioned to clear a structure such as, for example, a heat sink. The substrate 12 may in turn be coupled to another structure such as, for example, a PCB (printed circuit board). The connector 14 may in certain embodiments comprise a LIF (low insertion force) connector that includes a pin carrier and a plug. In other embodiments the connector 14 may be, for example, a ZIF (zero insertion force) connector. Any suitable connector may be used, including, for example, connectors that are solder bonded to another structure and that are solder bonded to the flex cable. As illustrated in FIG. 1, the connector 14 may be coupled to the substrate 12 using a suitable connection such as, for example, solder connections 18.

The flex cable 16A may be coupled to the connector 14 using a suitable connection, such as solder connections 20 positioned between flex cable 16A and connector 14. The flex cable 16A may also include electrical pathways 22 that extend from a bottom surface to a top surface thereof. The flex cable 16B may be coupled to the flex cable 16A using a suitable connection, such as solder connections 24. As noted above, the use of the stacked flex cable 16 including flex cables 16A and 16B permit each cable to route some of the signals instead of one flex cable routing all of the signals. As illustrated in FIG. 1, every other contact position on flex cable 16B is electrically coupled to the flex cable 16A through a solder connection 24, and every contact position on flex cable 16A is coupled to the array of contacts on the connector 14 through the solder connection 20. The electrical connections to the upper flex cable 16B may be made through the electrically conductive vias 22 extending thorough the flex cable 16A. As illustrated, all the signals passing through the connector 14 will be directed to the flex cable 16A. In certain embodiments, half of the signals directed to flex cable 16A will be sent through pathways in flex cable 16A and half of the signals will be sent through pathways in flex cable 16B. If desired, a capillary underfill using a suitable polymeric material 51, 53, 55 may be used to protect the various solder connections between the connector 14 and substrate 12, between the flex cable 16A and the connector 14, and between the flex cable 16A and the flex cable 16B.

Figure 2:
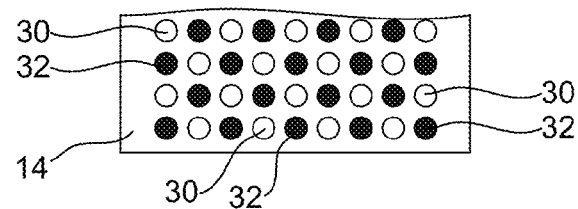
FIG. 2 illustrates a top down view of a connector used in accordance with certain embodiments.

FIG. 2 illustrates a view of the top surface of a portion of the connector 14, showing an array of contact locations 30, 32 that may be electrically coupled to one or more of flex cables 16A and 16B. In accordance with certain embodiments, all of the contact locations 30, 32 are electrically coupled to the lower flex cable 16A. Every other contact location 32 will also be electrically coupled through a via 22 and into electrical contact with the upper flex cable 16B.

Figure 3:
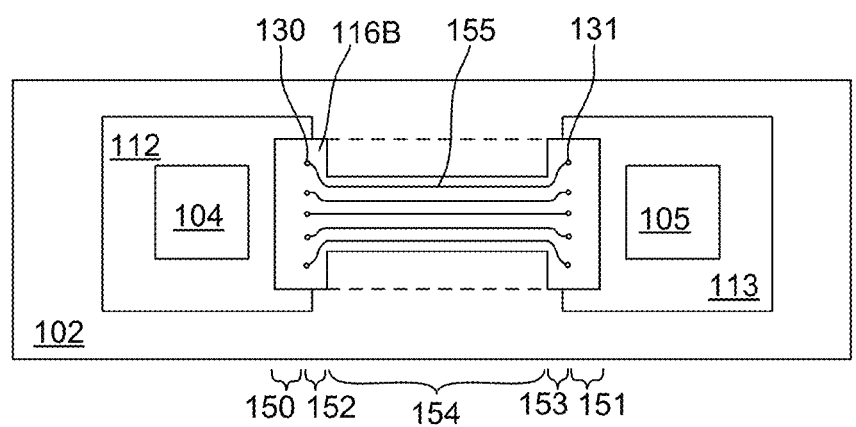
FIG. 3 illustrates a top down view of an assembly including a flex cable extending between two devices, in accordance with certain embodiments.

FIG. 3 illustrates a top view of an embodiment in which two devices are electrically coupled to one another through a stacked flex cable structure including first and second stacked flex cables. The embodiment of FIG. 3 includes a PCB 102 such as a motherboard, on which substrate bodies 112, 113 are positioned. The substrate bodies 112, 113 may be structures such as package substrates that include one or more electronic devices 104, 105 (including, for example, a semiconductor die) thereon. Signals may be passed between the electronic devices 104, 105 through a stacked flex cable structure. The stacked flex cable structure may include an upper flex cable 116B and a lower flex cable that is hidden from view by the upper flex cable 116B in FIG. 3.

The upper flex cable 116B includes connection regions positioned over the substrate bodies 112, 113 where electrical connections 130, 131 are made, a transmission region including traces 155 extending between the substrate bodies 112, 113, and break-out regions between the connection regions and the transmission region. The lengths of these regions are indicated by the brackets positioned just below the PCB 102 at a lower portion of FIG. 3, with the connection region having a length 150, 151, the transmission region having a length 154, and the break-out regions having a length 152, 153. The transmission region in FIG. 3 is substantially longer than the connection and break-out regions.

FIG. 3 also includes dotted lines extending between portions of the stacked flex cable 116B that corresponds to a width if instead of a stacked flex cable, only a single flex cable layer was used. In such a case, all traces between the substrate bodies would go through a one trace layer flex cable and the one layer flex cable would have to be relatively wide (e.g., the width of the dotted lines) in the transmission region to ensure that the spacing between the adjacent traces would provide adequate signal integrity, power, and loss properties. In contrast, when multiple stacked flex cables are used, the width of each flex cable may be more narrow because each flex cable layer only needs to accommodate some of the signals and as a result there can be less traces in each flex cable layer. In general, if two stacked flex cables are used, then the width of each may be decreased, for example, by about 50%. Certain embodiments may also use more than two stacked flex cables, which may permit even greater decreases in width.

Figure 4A:
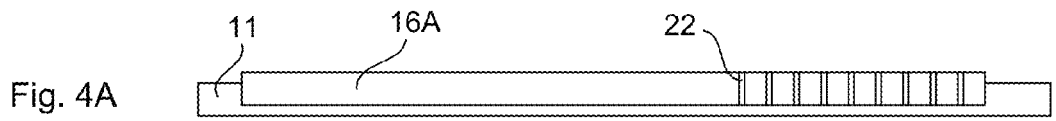
FIGS. 4A-4I illustrate operations for forming an assembly, in accordance with certain embodiments.
Figure 4B:
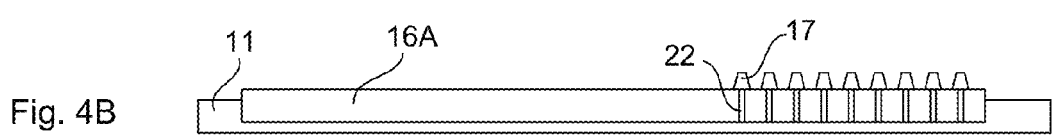

FIGS. 4A-4I illustrate processing operations for forming a stacked flex cable assembly such as that illustrated in FIG. 1, in accordance with certain embodiments. As illustrated in FIG. 4A, a first flex cable 16A may be positioned in a suitable pallet 11 for supporting the flex cable 16A during various processing operations, such as, for example, solder paste printing, placing other components onto the flex cable, and reflow. The pallet may also include a tension mechanism for holding the flex cable. The pallet may also include holes for heat transfer and include fiducial marks for alignment. The flex cable 16A may include a plurality of electrically conductive vias 22 therein. Solder paste 17 may be printed on the flex cable 16A in electrical contact with the vias 22, as illustrated in FIG. 4B.

Figure 4C:
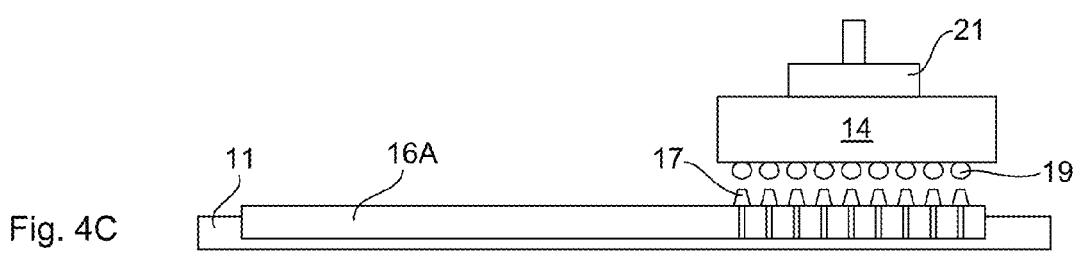
Figure 4D:
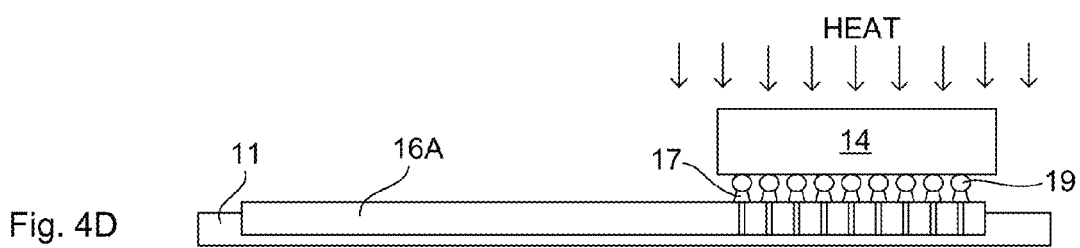
Figure 4E:
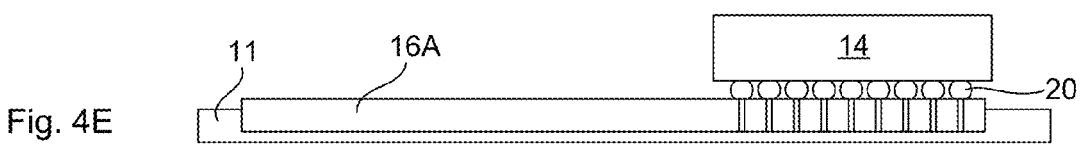
Figure 4F:
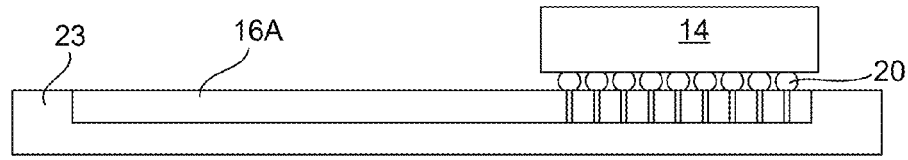

A connector 14 such as a LIF connector may be aligned with the flex cable 16A using a pick and place device 21 so that solder bumps 19 on the connector are aligned with the solder paste 17 on the flex cable 16A, as illustrated in FIG. 4C. Heat is applied to reflow the solder and join the connector 14 to the flex cable 16A through solder connections 20, as illustrated in FIGS. 4D-4E. As illustrated in FIG. 4F, the assembly may be removed from the pallet 11 and positioned in a suitable pick and place tray 23.

Figure 4G:
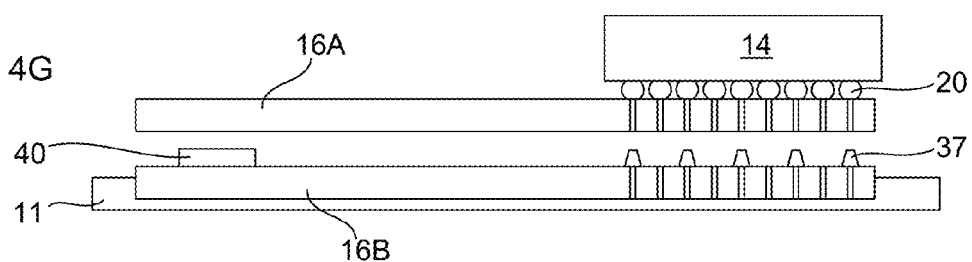
Figure 4H:
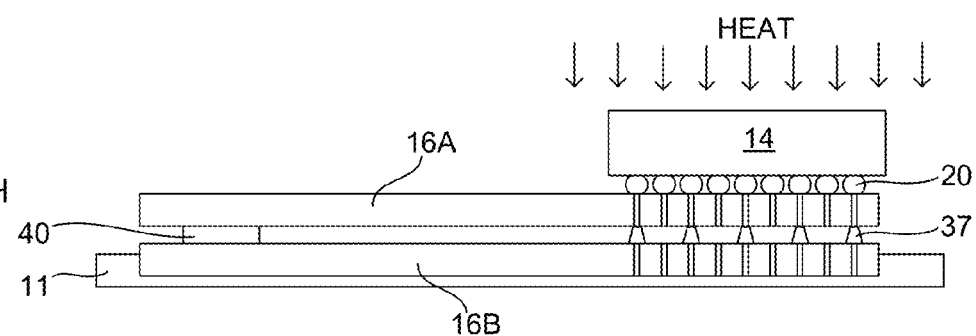
Figure 4I:
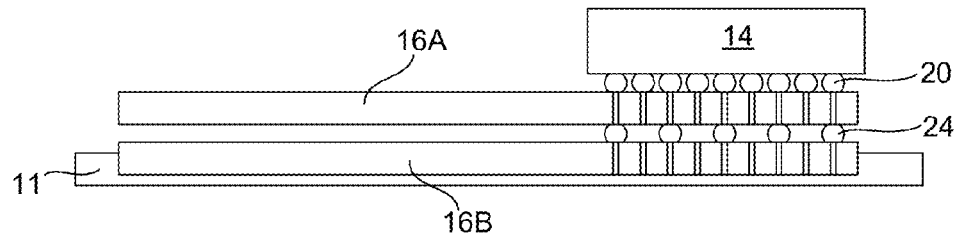

A second flex cable 16B may be positioned in a pallet 11 and processed in a similar manner as the first flex cable 16A to form solder paste 37 on the flex cable 16B. The solder paste 37 may be positioned on every other possible site, as illustrated in FIG. 4G. The assembly including the first flex cable 16A and the connector 14 may then be aligned with the flex cable 16B and heat applied to reflow and join the flex cable 16A to the flex cable 16B through solder connections 24, as illustrated in FIGS. 4H-4I. A spacer structure 40 may be positioned between the flex cables 16A and 16B, if desired, in order to assist in providing a uniform distance between the flex cables 16A and 16B. The spacer structure 40 may act to inhibit the assembly from bending due to, for example, the weight of the flex cable 16A adjacent to the solder connections. Certain embodiments may not require the use of such a spacer. The spacer structure 40 may take a variety of forms including, but not limited to, a block of solid material, one or more pins, or a material that hardens into a rigid spacer such as, for example, a glue or epoxy. The spacer 40 may be removed after the flex cables 16A and 16B are coupled to one another.

As described above in connection with FIGS. 4A-4I, for example, in accordance with certain embodiments, a connector may be coupled to a flex cable to form an assembly, and then the assembly may be coupled to another flex cable to form a stacked flex cable assembly. Other embodiments may couple together a plurality of flex cables, then couple a connector to the stacked flex cables.

Figure 5A:
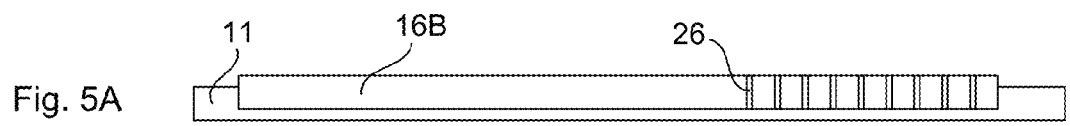
FIGS. 5A-5H illustrate operations for forming an assembly, in accordance with certain embodiments.
Figure 5B:
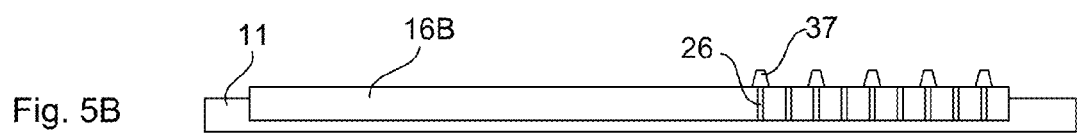
Figure 5C:
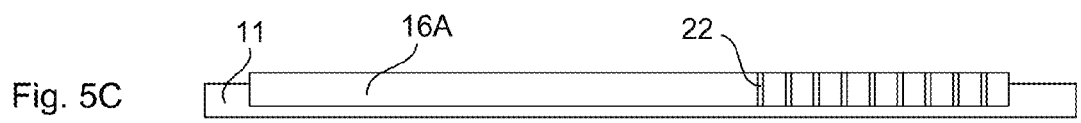
Figure 5D:
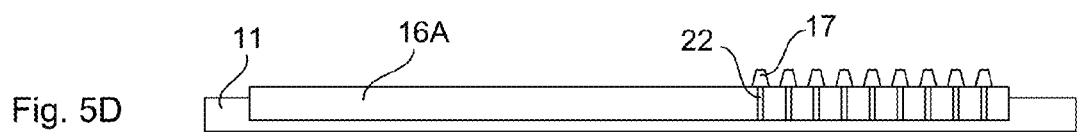

FIGS. 5A-5H illustrate processing operations for forming a stacked flex cable assembly, in accordance with certain embodiments, in which a plurality of flex cables are coupled together, then a connection is coupled thereto. As illustrated in FIG. 5A, a flex cable 16B may be positioned in a suitable pallet 11. The flex cable 16B may include a plurality of electrically conductive vias 26 therein. Solder paste 37 may be printed on the flex cable 16B in electrical contact with every other via 26, as illustrated in FIG. 5B. A flex cable 16A may be positioned in another pallet 11 and may include a plurality of electrically conductive vias 22 therein, as illustrated in FIG. 5C. Solder paste 17 may be printed on the flex cable 16A in electrical contact with the vias 22, as illustrated in FIG. 5D.

Figure 5E:
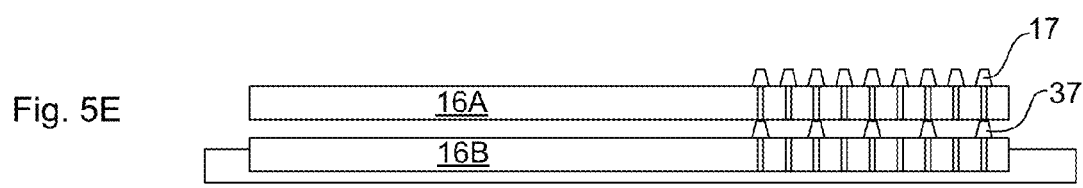
Figure 5F:
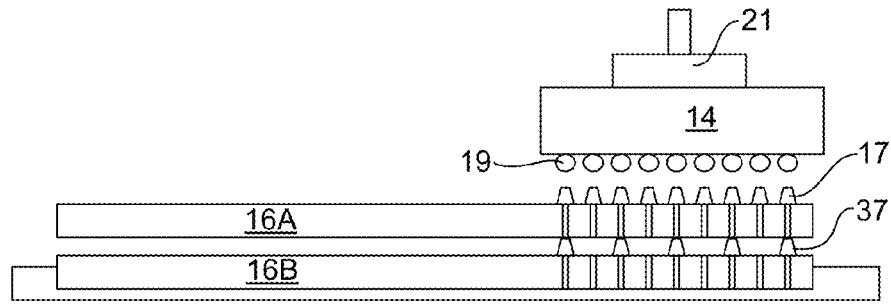
Figure 5G:
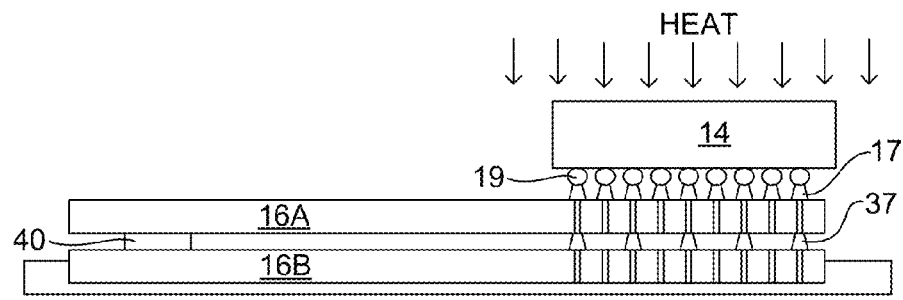
Figure 5H:
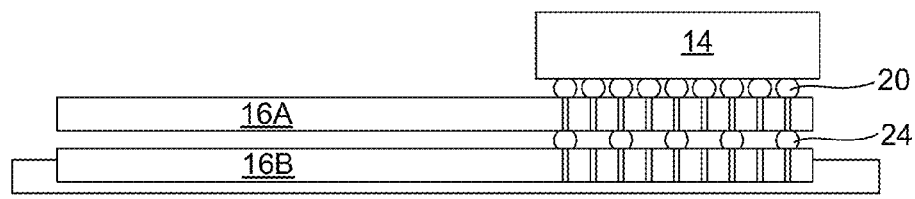

The flex cable 16A may be removed from the pallet and placed on the flex cable 16B, as illustrated in FIG. 5E. A connector 14 such as a LIF connector may be aligned with the flex cable 16A so that solder bumps 19 on the connector are aligned with the solder paste 17 on the flex cable 16A, as illustrated in FIG. 5F. Heat is applied to reflow the solder and join the connector 14 to the flex cable 16A through solder connections 20, as illustrated in FIGS. 5G-5H. If desired, a spacer such as the spacer 40 described above in connection with FIGS. 4G-4I may be utilized.

Figure 6A:
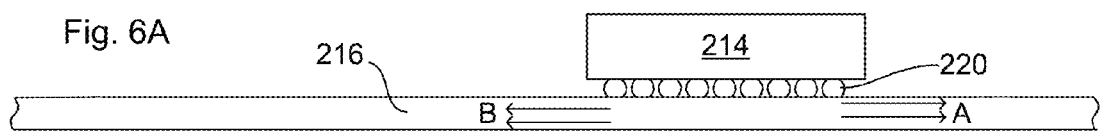
FIGS. 6A-6C illustrate operations for forming an assembly, in accordance with certain embodiments.
Figure 6B:
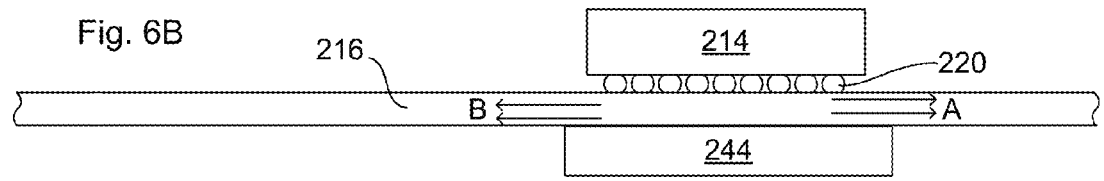
Figure 6C:
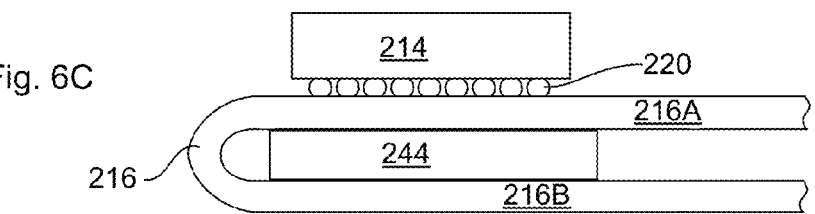

FIGS. 6A-6C illustrate the formation of a stacked flex cable assembly in accordance with certain embodiments, in which a portion of a flex cable is bent around a body to form the stacked assembly. As illustrated in FIG. 6A, a flex cable 216 may be electrically coupled to a connector 214 such as a LIF connector using solder connections 220. A body 244 such as a stiffener is also coupled to the flex cable 216. The flex cable 216 is positioned between the connector 214 and the body 244. If desired, an adhesive may be positioned between the body 244 and the flex cable 216, on one or both sides of the body 244. The connector 214 is electrically coupled to the flex cable 216 so that a first group of signals will travel in one direction (as indicated by arrows A) along the flex cable 216 and a second group of the signals (as indicated by arrows B) will travel in an opposite direction along the flex cable 216.

The flex cable 216 may be bent around the body 244 so that part of the flex cable folds back over itself as illustrated in FIG. 6C. The flex cable 216 will then be configured to have a stacked structure, with a first flex cable portion 216A and a second flex cable portion 216B. Signals traveling in the direction indicated by the arrows A (FIG. 6B) will travel along flex cable portion 216A (FIG. 6C). Signals traveling in the direction indicated by arrows B (FIG. 6B) will travel around the curved portion of flex cable 216, and then along the flex cable portion 216B. Such a structure permits the flex cable 216 to be made more narrow because the stacked structure enables, for example, half of the signals to be transmitted along direction A and along flex cable portion 216A and half of the signals to be transmitted along direction B and along flex cable portion 216B.

Figure 7:
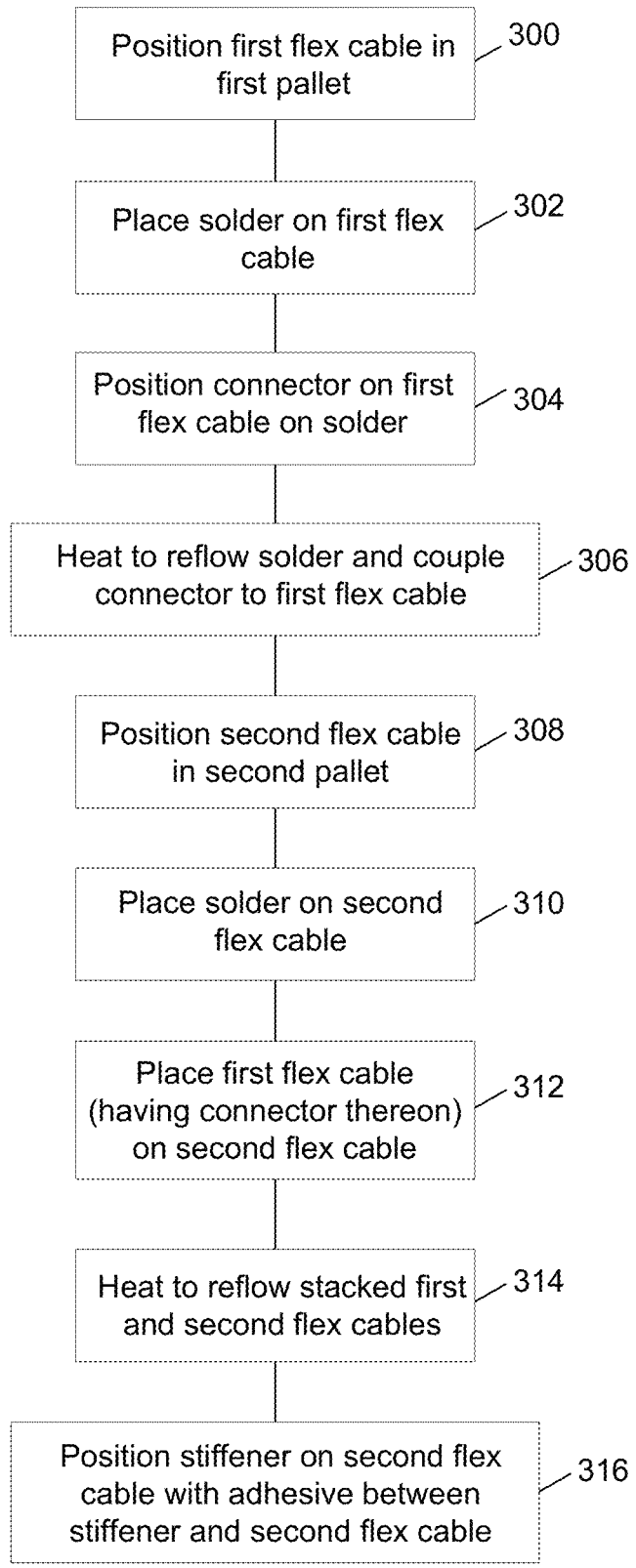
FIG. 7 illustrates a flow chart including operations for forming an assembly, in accordance with certain embodiments.

FIG. 7 illustrates a flowchart of operations for forming an assembly in accordance with certain embodiments. Box 300 is positioning a first flex cable in a first pallet or other holding mechanism for processing. Box 302 is placing solder on the first flex cable in desired locations for electrically coupling the first flex cable to a connector. The solder may be in the form of a solder paste that is printed on the first flex cable. Box 304 is positioning the connector on the first flex cable on the solder paste. The connector may be any suitable connector for coupling a flex cable to a substrate, including, but not limited to, a LIF connector or a ZIF connector. The connector may have solder positioned thereon that is aligned with the solder on the first flex cable. Box 306 is heating the assembly to reflow the solder and couple the first flex cable to the connector.

Box 308 is positioning a second flex cable in a pallet or other holding mechanism for processing. Box 310 is placing solder on the second flex cable in desired locations for electrically coupling the second flex cable to the first flex cable. The solder may be in the form of a solder paste that is printed on the first flex cable. Box 312 is positioning the first flex cable that has the connector coupled thereto on the second flex cable. Box 314 is heating the assembly to reflow the solder and join the second flex cable to the first flex cable. Box 316 is positioning a stiffener on the second flex cable. Adhesive may be positioned if desired between the stiffener and the second flex cable. The stiffener may be positioned so that the second flex cable is between the stiffener and the first flex cable. It should be appreciated that various of the operations in the flowchart may be modified or are optional, and additional operations may be added. For example, an operation of inserting a spacer on the first flex cable may be included between boxes 310 and 312 to inhibit bending.

Figure 8:
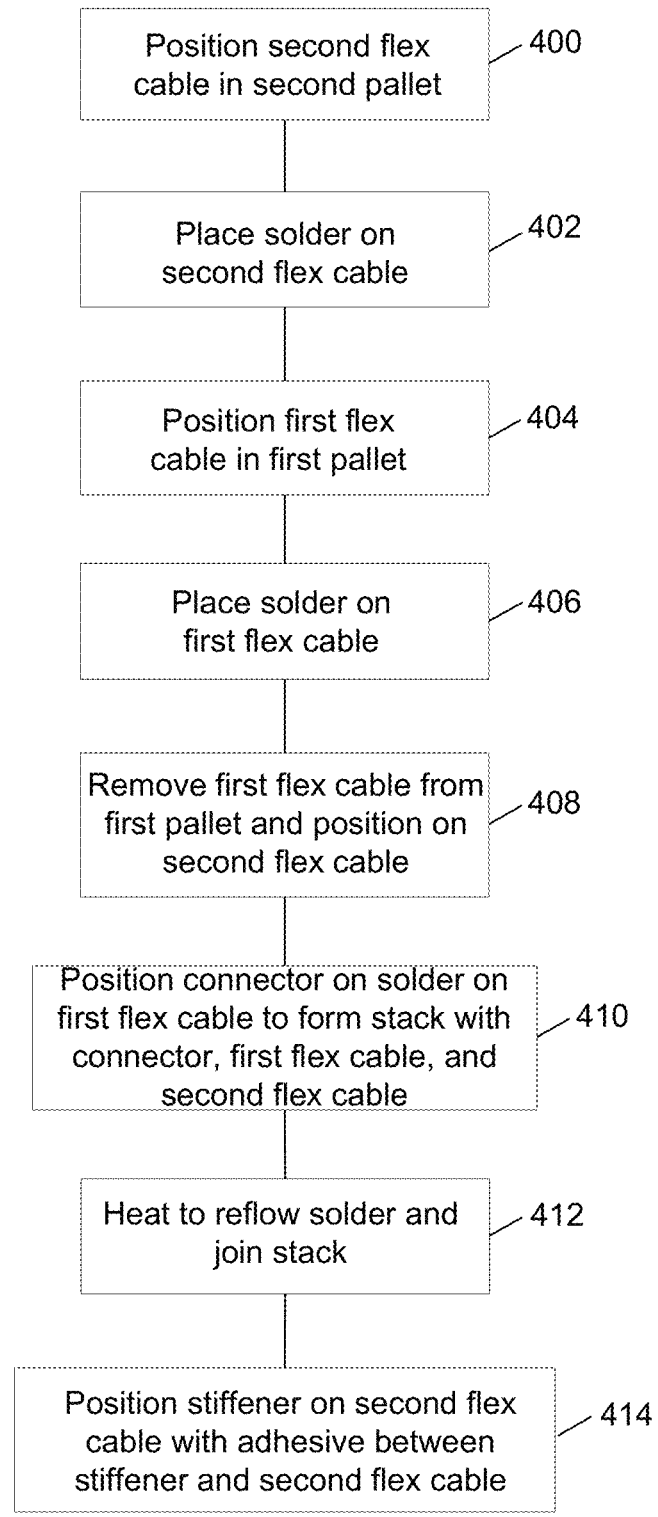
FIG. 8 illustrates a flow chart including operations for forming an assembly, in accordance with certain embodiments.

FIG. 8 illustrates a flowchart of operations for forming an assembly in accordance with certain embodiments. Box 400 is positioning a second flex cable in a second pallet or other holding mechanism for processing. Box 402 is placing solder on the second flex cable in desired locations for electrically coupling the second flex cable to a first flex cable. The solder may be in the form of a solder paste that is printed on the second cable. Box 404 is positioning a first flex cable in a first pallet or other holding mechanism for processing. Box 406 is placing solder on the first flex cable in desired locations for electrically coupling the first flex cable to a connector in a subsequent operation. The solder may be in the form of a solder paste that is printed on the second cable. Box 408 is removing the first flex cable from its holding mechanism and positioning the first flex cable on the second flex cable.

Box 410 is positioning a connector on the solder on the first flex cable to form a stack with the connector, the first flex cable, and the second flex cable. The connector may be any suitable connector for coupling a flex cable to a substrate, including, but not limited to, a LIF connector or a ZIF connector. The connector may have solder positioned thereon that is aligned with the solder on the first flex cable. Box 412 is heating the assembly to reflow the solder between the connector and the first flex cable and between the first flex cable and the second flex cable, for form solder joints coupling the stack together. Box 414 is positioning a stiffener on the second flex cable. Adhesive may be positioned if desired between the stiffener and the second flex cable. The stiffener may be positioned so that the second flex cable is between the stiffener and the first flex cable. It should be appreciated that various of the operations in the flowchart may be modified or are optional, and additional operations may be added. For example, the order of operations may be modified so that Box 400 and Box 402 are switched with Box 404 and 406.

The process set forth in FIG. 8 differs from that set forth in FIG. 7 is several aspects. One difference is that the operations described in FIG. 8 include a single reflow operation for coupling the connector to the first flex cable and for coupling the first and second flex cables together, whereas the operations described in FIG. 7 include a reflow operation for coupling the connector and the first flex cable, and then another reflow operation for coupling the first and second flex cables.

Figure 9:
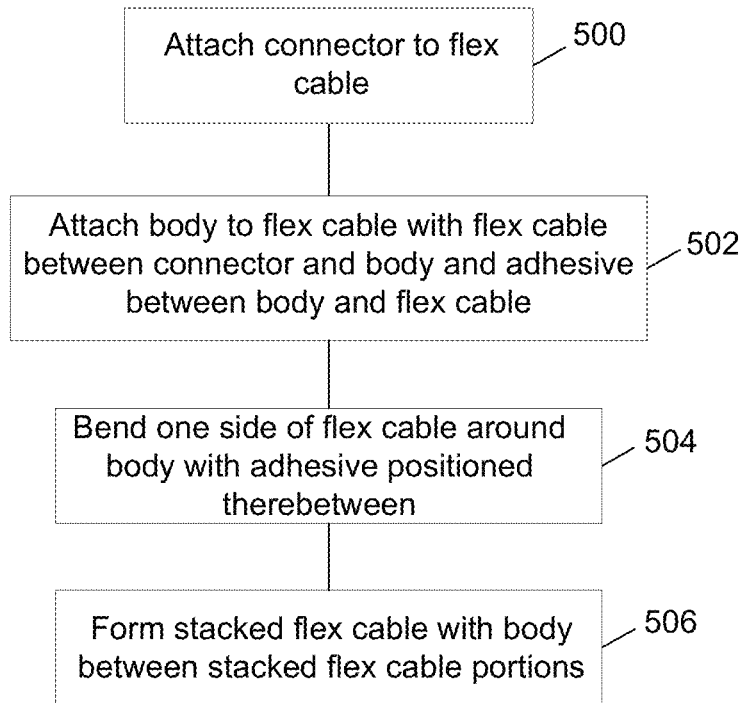
FIG. 9 illustrates a flow chart including operations for forming an assembly, in accordance with certain embodiments.

FIG. 9 illustrates operations for forming an assembly in accordance with certain embodiments. Box 500 is coupling a connector to a flex cable. The connector may be any suitable connector for coupling a flex cable to a substrate, including, but not limited to, a LIF connector or a ZIF connector. A solder joint connection may be used to couple the connector to the flex cable. Box 502 is attaching a body to the flex cable. The body may take the form of a stiffener that is coupled to an opposite surface than the connector is coupled to. An adhesive may be used if desired to obtain a good bond between the stiffener and the flex cable. Box 504 is bending the flex cable around the body so that the flex cable extends in approximately a 180 degree path, resulting in a stacked flex cable having a first flex cable portion on one side of the body and a second flex cable portion on a second side of the body. An adhesive may be positioned between the second flex cable portion and the second side of the body, if desired.

The first flex cable portion and the second flex cable portion will in certain embodiments be substantially parallel to one another in regions beyond the curved region that extends around part of the body. The connector and flex cable are configured so that a first group of signals passing from the connector to the flex cable may travel along the first flex cable portion and a second group of signals may travel around the curved region and along the second flex cable portion. Such a structure formed using an embodiment such as described in connection with FIG. 9 enables a stacked flex cable configuration while using a single flex cable. It should be appreciated that a variety of modifications, deletions, and additions may be made to the operations described in FIG. 9. For example, the order of coupling the connector and the body to the flex cable may be reversed so that the body is first coupled and then the connector is coupled. In addition, the flex cable may in certain embodiments be bent around the body prior to the connector being coupled thereto.

Figure 10:
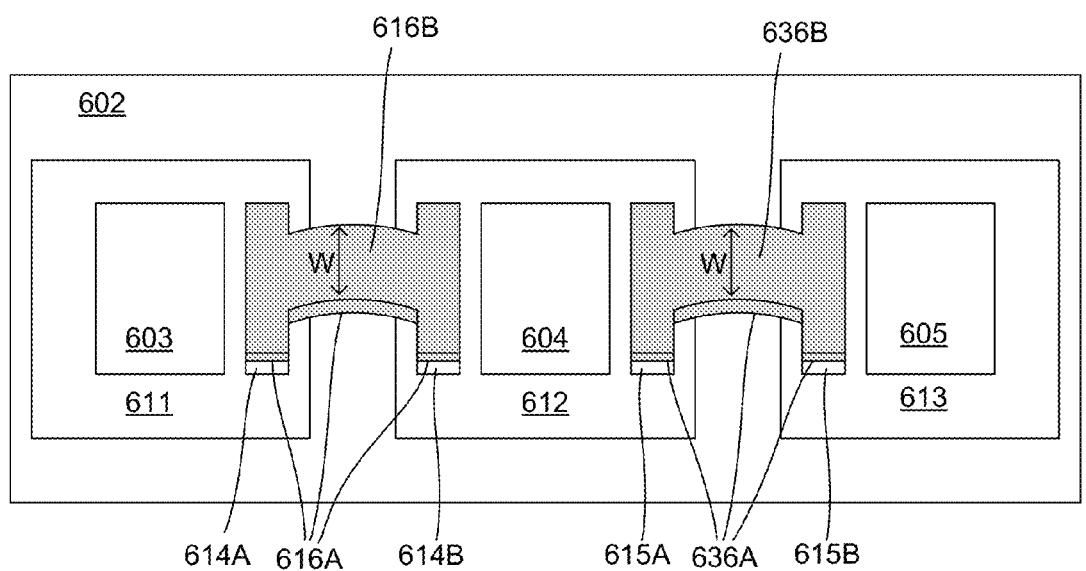
FIG. 10 illustrates a side elevated view of an assembly, in accordance with certain embodiments.

Embodiments are applicable to a variety of configurations of electronic devices. FIG. 10 illustrates a side elevation view including a plurality of substrates 611, 612, 613 positioned on a PCB 602, in accordance with certain embodiments. Each of the substrates 611, 612, 613 includes a semiconductor device 603, 604, 605 such as, for example, a CPU. A plurality of stacked flex cable assemblies and are used to electrically couple the semiconductor devices 603, 604, 605 together. A first stacked flex cable assembly as illustrated in FIG. 10 includes first stacked flex cables 616A and 616B, which are electrically coupled to connector 614A on substrate 611 and to connector 614B on substrate 612. A second stacked flex cable assembly as illustrated in FIG. 10 includes stacked flex cables 636A and 636B, which are electrically coupled to connector 615A on substrate 612 and to connector 615B on substrate 613. As seen in FIG. 10, the stacked flex cables 616A, 616B and 636A, 636B have a width dimension W that is more narrow in the transmission region of the flex cables than in the connection regions over the connectors 614A, 614B, 615A, 615B. As a result, other components such as, for example, a portion of a heat sink, may be positioned in these more narrow regions. Alternatively, these more narrow regions may be maintained so that enhanced air flow can be achieved in the assembly.

Various embodiments as described herein may provide one or more advantages over conventional flex cable configurations that have one layer of signal traces for transmitting signals. By providing a plurality of stacked flex cable portions, each of the stacked flex cable portions may be made more narrow because it does not need to house all the signal traces for transmitting the signals. As a result, additional open spaces within an electronic assembly or system may be provided that enable other components to be fit within the open space and/or which permit improved airflow through the system. A variety of processing schemes may be utilized for forming stacked flex cable structures, including those with separate flex cables that are coupled together and those with a single flex cable that is bent to form a layered configuration.

Figure 11:
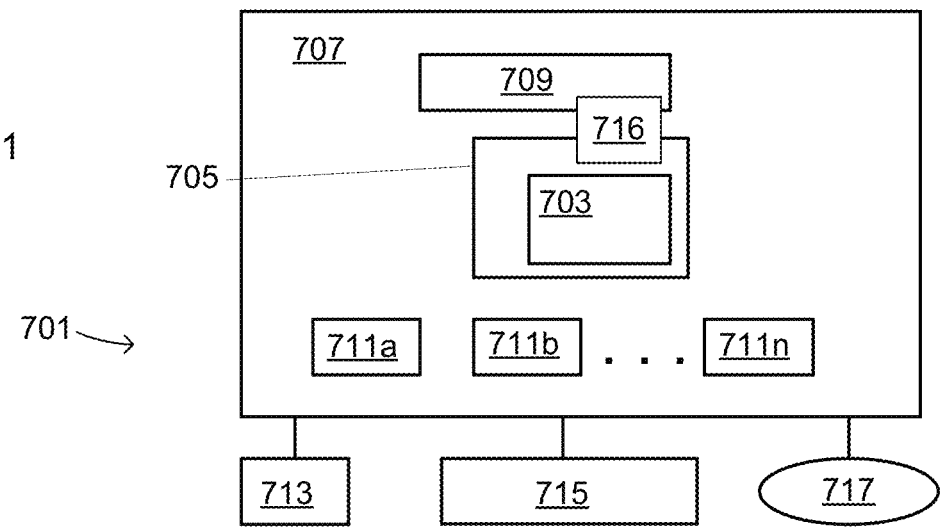
FIG. 11 illustrates an electronic system arrangement in which embodiments may find application.

Assemblies including components formed as described in embodiments above may find application in a variety of electronic components. FIG. 11 schematically illustrates one example of an electronic system environment in which aspects of described embodiments may be embodied. Other embodiments need not include all of the features specified in FIG. 11, and may include alternative features not specified in FIG. 11.

The system 701 of FIG. 11 may include at least one central processing unit (CPU) 703. The CPU 703, also referred to as a microprocessor, may be a die which is attached to an integrated circuit package substrate 705, which is then coupled to a PCB 707, which in this embodiment, may be a motherboard. A variety of other system components, including, but not limited to memory and other components discussed below, may also include structures formed in accordance with the embodiments described above.

The system 701 may further include memory 709 and one or more controllers 711a, 711b . . . 711n, which are also disposed on the PCB 707. The CPU 703 and memory 709 are examples of components that may be electrically connected to one another in accordance with embodiments such as described above, using a stacked flex cable 716. The PCB 707 may be a single layer or multi-layered board which has a plurality of conductive lines that may provide communication between the circuits various components mounted to the board 707. Alternatively, one or more of the CPU 703, memory 709 and controllers 711a, 711b . . . 711n may be disposed on other cards such as daughter cards or expansion cards. At least some of the components may alternatively be seated in individual sockets or may be connected directly to a printed circuit board. A display 715 may also be included. The display 715 may in certain embodiments be an interactive touch screen.

Any suitable operating system and various applications execute on the CPU 703 and reside in the memory 709. The content residing in memory 709 may be cached in accordance with known caching techniques. Programs and data in memory 709 may be swapped into storage 713 as part of memory management operations. The system 701 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 711a, 711b . . . 711n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 713 in accordance with a storage protocol layer. The storage protocol of the layer may be any of a number of known storage protocols. Data being written to or read from the storage 713 may be cached in accordance with known caching techniques. A network controller can include one or more protocol layers to send and receive network packets to and from remote devices over a network 717. The network 717 may comprise, for example, a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are intended to denote the relative position of certain features. Embodiments may be manufactured, used, and contained in a variety of positions and orientations.

While certain exemplary embodiments have been described and shown in the accompanying drawings, it is to be understood that such embodiments are merely illustrative and not restrictive, and that embodiments are not restricted to the specific constructions and arrangements shown and described since modifications may occur to those having ordinary skill in the art. Various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment.

EXAMPLES

The following examples pertain to further embodiments.

Example 1 is a stacked flex cable comprising: a first flex cable; a second flex cable electrically coupled to the first flex cable; and a connector electrically coupled to the first flex cable; wherein the first flex cable is positioned between the connector and the second flex cable.

In Example 2, the subject matter of Example 1 may optionally include wherein the first flex cable and the second flex cable are electrically coupled to each other through a solder connection.

In Example 3, the subject matter of any of Examples 1-2 may optionally include wherein the second flex cable is positioned over the first flex cable.

In Example 4, the subject matter of any of Examples 1-3 may optionally include a stiffener coupled to the second flex cable, wherein the stiffener is positioned over the second flex cable.

In Example 5, the subject matter of any of Examples 1-4 may optionally include wherein the connector is coupled to a substrate.

In Example 6, the subject matter of any of Examples 1-5 may optionally include a semiconductor die coupled to the substrate, wherein the connector is electrically coupled to the semiconductor die.

Example 7 is a stacked flex cable assembly comprising: a first flex cable portion; a second flex cable portion positioned over the first flex cable portion; and a connector electrically coupled to the first flex cable portion; wherein the first flex cable portion is positioned between the connector and the second flex cable portion.

In Example 8, the subject matter of Example 7 may optionally include wherein the first flex cable portion and the second flex cable portion are part of a common flex cable.

In Example 9, the subject matter of Example 8 may optionally include wherein the common flex cable includes a curved region positioned between the first flex cable portion and the second flex cable portion.

In example 10, the subject matter of any of Examples 7-9 may optionally include wherein the second flex cable portion is positioned directly over the first flex cable portion.

In example 11, the subject matter of any of Examples 7-10 may optionally include a body positioned between the first flex cable portion and the second flex cable portion.

In Example 12, the subject matter of any of Examples 7-11 may optionally include a stiffener positioned between the first flex cable portion and the second flex cable portion, the stiffener being positioned over the connector.

In Example 13, the subject matter of any of Examples 7-12 may optionally include wherein the connector is coupled to a substrate, the assembly further comprising a semiconductor die coupled to the substrate, wherein the connector is electrically coupled to the semiconductor die.

In Example 14, the subject matter of any of Examples 7-13 may optionally include wherein the first flex cable portion and the second flex cable portion are separate flex cables.

Example 15 is a method for forming a stacked flex cable assembly, comprising: coupling a first flex cable to a second flex cable; and coupling a connector to the first flex cable; wherein the first flex cable is positioned between the connector and the second flex cable.

In Example 16, the subject matter of Example 15 may optionally include wherein the coupling the connector to the first flex cable comprises forming a solder connection between the connector and the first flex cable, and wherein the coupling the first flex cable to the second flex cable comprises forming a solder connection between the first flex cable and the second flex cable.

In Example 17, the subject matter of any of Examples 15-16 may optionally include wherein the coupling the connector to the first flex cable is carried out prior to the coupling the first flex cable to the second flex cable.

In Example 18, the subject matter of any of Examples 15-16 may optionally include wherein the forming a solder connection between the connector and the first flex cable and the forming a solder connection between the first flex cable and the second flex cable are carried out during a single heating operation.

In Example 19, the subject matter of any of Examples 15-18 may optionally include positioning the connector on a substrate in electrical contact with a semiconductor die.

Example 20 is a method for forming a stacked flex cable assembly, comprising: providing a flex cable including a first flex cable portion and a second flex cable portion; coupling a connector to the flex cable; coupling a body to the flex cable, wherein the body is positioned on an opposite side of the flex cable than the connector; and bending the flex cable around the body so that the resultant flex cable comprises a first flex cable portion positioned on a first side of the body, a second flex cable portion positioned on a second side of the body opposite the first side, and a curved flex cable portion connecting the first flex cable portion and the second flex cable portion.

In Example 21, the subject matter of Example 20 may optionally include wherein the coupling the connector to the flex cable is carried out prior to the coupling the body to the flex cable.

In Example 22, the subject matter of any of Examples 20-21 may optionally include wherein the coupling the connector to the flex cable is carried out prior to the coupling the body to the flex cable.

In Example 23, the subject matter of any of Examples 20-22 may optionally include coupling the connector to the flex cable so that: a first group of electrical signals may travel from the connector away from the curved region and along the first flex cable region; and a second group of electrical signals passed through the connector may travel from the connector towards and around the curved flex cable portion and along the second flex cable portion.

In Example 24, the subject matter of any of Examples 15-23 may optionally include wherein the second flex cable portion extends in a direction parallel to that of the first flex cable portion.

In Example 25, the subject matter of any of Examples 20-24 may optionally include positioning the connector on a substrate in electrical contact with a semiconductor die.

Example 26 is a stacked flex cable assembly comprising a connector means for making an electrical connection between two structures; a first flex cable means coupled to the connector means, for conducting electrical signals; a second flex cable means for conducting electrical signals; and coupling means for electrically coupling the first flex cable means to the second flex cable means so that the first flex cable means is positioned between the connector and the second flex cable means.

In Example 27, the subject matter of Example 26 may optionally include wherein the coupling means includes a solder connection.

In Example 28, the subject matter of Examples 26-27 may optionally include means for positioning the second flex cable means over the first flex cable means.

In Example 29, the subject matter of Examples 26-28 may optionally include stiffener means coupled to the second flex cable means and positioned over the second flex cable means for providing rigidity to the assembly.

In Example 30, the subject matter of Examples 26-29 may optionally include a substrate, wherein the connector means is coupled to the substrate.

In Example 31, the subject matter of Example 30 may optionally include a semiconductor die coupled to the substrate, and means for electrically coupling the connector means to the semiconductor die.

Example 32 is a stacked flex cable assembly comprising: a connector means for making an electrical connection between two structures; first flex cable portion means for conducting electrical signals, second flex cable portion means for conducting electrical signals; coupling means for electrically coupling the first flex cable portion means to the connector means and for positioning the first flex cable portion means between the connector means and the second flex cable portion means.

In Example 33, the subject matter of Example 32 may optionally include wherein the first flex cable portion means and the second flex cable portion means are part of a common flex cable means.

In Example 34, the subject matter of Examples 32-33 may optionally include wherein the common flex cable means includes a curved region positioned between the first flex cable portion means and the second flex cable portion means.

In Example 35, the subject matter of Examples 32-34 may optionally include wherein the second flex cable portion means is positioned directly over the first flex cable portion means.

In Example 36, the subject matter of Examples 32-35 may optionally include body means for separating the first flex cable portion means and the second flex cable portion means.

In Example 37, the subject matter of Examples 32-35 may optionally include stiffener means to stiffen the assembly, and coupling means for positioned the stiffener means between the first flex cable portion means and the second flex cable portion means, the stiffener means being positioned over the connector means.

In Example 38, the subject matter of Examples 32-37 may optionally include coupling means for coupling the connector means to a substrate, the assembly further comprising a semiconductor die coupled to the substrate, wherein the connector means is electrically coupled to the semiconductor die.

In Example 39, the subject matter of Examples 32-38 may optionally include wherein the first flex cable portion means and the second flex cable portion means comprise separate flex cables.

Example 40 is a computer program product, comprising a computer readable storage medium having computer readable program code embodied therein executable by a processor to perform the method of any one of Examples 15-25.

Example 41 is a computer program product, comprising a computer readable storage medium having computer readable program code embodied therein executable by a processor to implement a method or realize the apparatus of any one of the above Examples 1-40.

What is claimed:
1. A stacked flex cable assembly comprising:
a first flex cable;
a second flex cable on the first flex cable;
a connector electrically coupled to the first flex cable and to the second flex cable;
a substrate electrically coupled to the connector;
the first flex cable including a plurality of electrically conductive vias electrically coupled to the second flex cable and to the connector;
wherein the first flex cable is positioned between the connector and the second flex cable; and
wherein the connector is positioned between the substrate and the first flex cable.

2. The stacked flex cable assembly of claim 1, comprising a solder connection electrically coupling the substrate and the connector.

3. The stacked flex cable assembly of claim 1, comprising a solder connection between the first flex cable and the second flex cable.

4. The stacked flex cable assembly of claim 1, wherein the second flex cable is positioned over the first flex cable.

5. The stacked flex cable assembly of claim 1, further comprising a stiffener coupled to the second flex cable, wherein the second flex cable is positioned between the stiffener and the first flex cable.

6. The stacked flex cable assembly of claim 1, wherein the substrate comprises a structure selected from the group consisting of a semiconductor die, a package including a semiconductor die, and a dongle.

7. The stacked flex cable assembly of claim 1, wherein the second flex cable is positioned directly above the first flex cable along its entire length.

8. The stacked flex cable assembly of claim 1, wherein the first flex cable has a length that is equal to that of the second flex cable, and wherein the second flex cable is positioned directly over the first flex cable along the entire length.

9. The stacked flex cable assembly of claim 1, the first flex cable further comprising a plurality of electrically conductive vias electrically coupled to the connector and electrically isolated from the second flex cable.

10. A stacked flex cable assembly comprising:
a first flex cable portion comprising a plurality of traces extending along a length thereof;
a second flex cable portion comprising a plurality of traces extending along a length thereof;
a connector electrically coupled to the first flex cable portion and to the second flex cable portion;

the first flex cable portion further comprising a plurality of electrically conductive vias through which the second flex cable portion is electrically coupled to the connector; and wherein the first flex cable portion is positioned between the connector and the second flex cable portion.

11. The stacked flex cable assembly of claim 10, further comprising a substrate electrically coupled to the connector.

12. The stacked flex cable assembly of claim 10, wherein the first flex cable portion has a length that is equal to that of the second flex cable portion.

13. The stacked flex cable assembly of claim 10, the first flex cable portion further comprising a plurality of electrically conductive vias electrically coupled to the connector and electrically isolated from the second flex cable portion.

14. The stacked flex cable assembly of claim 10, wherein the first flex cable portion and the second flex cable portion are separate flex cables.

15. The stacked flex cable assembly of claim 10, wherein the first flex cable portion and the second flex cable portion are part of a common flex cable.

16. The stacked flex cable assembly of claim 15, wherein the common flex cable includes a curved region positioned between the first flex cable portion and the second flex cable portion.

17. The stacked flex cable assembly of claim 10, wherein the second flex cable portion is positioned directly over the first flex cable portion.

18. The stacked flex cable assembly of claim 10, further comprising a body positioned between the first flex cable portion and the second flex cable portion.

19. The stacked flex cable assembly of claim 10, further comprising a stiffener positioned between the first flex cable portion and the second flex cable portion, the stiffener being positioned over the connector.

20. A stacked flex cable assembly, comprising:

a first flex cable portion comprising a plurality of traces extending along a length thereof and a plurality of electrically conductive vias extending from a bottom surface to a top surface of the first flex cable portion;

a second flex cable portion comprising a plurality of traces extending along a length thereof and a plurality of electrically conductive vias extending from a bottom surface to a top surface of the second flex cable portion;

a connector electrically coupled to the first flex cable portion and to the second flex cable portion;

wherein every alternate electrically conductive via in the first flex cable portion is electrically coupled to a respective electrically conductive via in the second flex cable portion; and wherein the first flex cable portion is positioned between the connector and the second flex cable portion.

21. The stacked flex cable assembly of claim 20, further comprising a substrate electrically coupled to the connector, the connector positioned between the substrate and the first flex cable portion.

22. The stacked flex cable assembly of claim 21, wherein the substrate comprises a structure selected from the group consisting of a semiconductor die, a package including a semiconductor die, and a dongle.

23. The stacked flex cable assembly of claim 20, wherein the first flex cable portion has a length that is equal to that of the second flex cable portion.

* * * * *